United States Patent [19]

Andreev et al.

[11] Patent Number: 6,070,108
[45] Date of Patent: May 30, 2000

[54] METHOD AND APPARATUS FOR CONGESTION DRIVEN PLACEMENT

[75] Inventors: Alexander E. Andreev, Moskovskaga Oblast, Russian Federation; Ivan Pavisic, Cupertino; Ranko Scepanovic, San Jose, both of Calif.

[73] Assignee: LSI Logic Corporation, Milpitas, Calif.

[21] Appl. No.: 08/906,950

[22] Filed: Aug. 6, 1997

[51] Int. Cl.[7] ....................................................... G06F 19/00
[52] U.S. Cl. ................ 700/121; 395/500.03; 395/500.09
[58] Field of Search .......................... 395/500.02, 500.03, 395/500.11, 500.09; 700/96, 121

[56] References Cited

U.S. PATENT DOCUMENTS

| | | | |
|---|---|---|---|
| 5,491,641 | 2/1996 | Scepanovic et al. | 364/491 |
| 5,495,419 | 2/1996 | Rostoker et al. | 364/468.28 |
| 5,568,322 | 10/1996 | Azami et al. | 359/689 |
| 5,568,636 | 10/1996 | Koford | 395/500 |
| 5,578,840 | 11/1996 | Scepanovic et al. | 257/207 |
| 5,587,923 | 12/1996 | Wang | 364/490 |
| 5,615,128 | 3/1997 | Scepanovic et al. | 364/489 |
| 5,618,744 | 4/1997 | Suzuki et al. | 438/599 |
| 5,636,125 | 6/1997 | Rostoker et al. | 364/468.28 |
| 5,638,293 | 6/1997 | Scepanovic et al. | 364/491 |
| 5,661,663 | 8/1997 | Scepanovic et al. | 364/490 |
| 5,682,322 | 10/1997 | Boyle et al. | 364/491 |
| 5,712,793 | 1/1998 | Scepanovic et al. | 364/490 |
| 5,737,236 | 4/1998 | Maziasz et al. | 364/490 |
| 5,742,510 | 4/1998 | Rostoker et al. | 364/468.03 |
| 5,745,363 | 4/1998 | Rostoker et al. | 364/468.28 |
| 5,808,899 | 9/1998 | Scepanovic et al. | 364/491 |

*Primary Examiner*—William Grant
*Assistant Examiner*—Chad Rapp
*Attorney, Agent, or Firm*—Mitchell, Silberberg & Knupp

[57] ABSTRACT

Integrated circuit chips (IC's) require proper placement of many cells (groups of circuit components) and complex routing of wires to connect the pins of the cells. Because of the large number of the cells and the complex connections required, it is essential that wire routine be done correctly to avoid any congestion of wires. Placement of the cells and the routing of the wires to avoid congestion can be accomplished by determining congestion of various regions of the IC's after an initial placement of the cells and routing of the wires. The present invention discloses a method and apparatus to determine the congestion of the regions and a technique to increase the fictive heights (or, the "working height", or the "working size") of the cells for repeating the placement of the cells if the current placement and routing leads to congestion. The present invention provides for a method of defining regions and line segment. Then, each segment is analyzed to determine the ratio of the wire density of the segment to the wire capacity of the segment. If the ratio is greater than a predetermined value, then the fictive heights of the cells of the affected regions are increased and the placement is repeated.

16 Claims, 5 Drawing Sheets

METHOD AND APPARATUS FOR CONGESTION DRIVEN PLACEMENT

BACKGROUND OF THE INVENTION

1. Field of the Invention

The present invention generally relates to the art of microelectronic integrated circuits. In particular, the present invention relates to the art of placing cells on semiconductor chips with controlled wire congestion.

2. Description of Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

FIG. 1 shows a common organization of an IC. On a semiconductor substrate 10, vertical strips of alternating columns 12 and channels 14 are defined. The cells 16 are fabricated in the columns, and the channels are typically used for running vertical wires to connect the pins 18 of the cells 16. For illustrative purposes, only the rectilinear connections as illustrated by the wire 20. Therefore, all distances are measured using rectilinear or Manhattan distance.

For simplicity, the chip 8 of FIG. 1 shows only a few columns; however, in a practical implementation, it is common for a chip to have many hundreds of columns and channels, and hundreds of thousands of cells and about the same number of nets.

The channels of a chip are commonly used to run vertical wires for the chip. To run horizontal wires, another layer of material is fabricated on the surface of the chip. Via's are used to bring the pins up to the second layer for the horizontal connections. If the surface area is at premium, yet another, third layer of material may be fabricated on top of the horizontal-wire layer. This third layer may be used to run the vertical wires, and the width of the channels may be reduced to decrease the overall surface area requirement.

Because there are a large number of pins to connect and the complex nature of the connections required, a proper placement of the cells and the routing of the wires are critical for a successful implementation of a chip. Some placement and routing schemes may result in uneven distribution of cells and wires leading to congestion in some areas of the chip while other areas of the chip may be sparsely used. If the congestion is such that the number of wires required to connect the nets for a particular area is greater than the maximum number of wires which can be fabricated on that region, then that placement cannot be implemented.

SUMMARY OF THE INVENTION

Therefore, an object of the present invention is to provide for a method and apparatus to determine the placement of the cells depending upon congestion levels of the various regions of the chip.

The present invention provides for a method of placing cells on an integrated circuit device (IC). The method comprises the steps to place the cells on the device; to determine wire routing for the nets of the IC; to determine congested regions of the IC; and to increase fictive heights of cells of the congested regions. And, to run the placement algorithm again.

The present invention also provides for an semiconductor device having cells placed on the device in accordance with the congestion driven method as described in this application.

The present invention also provides for an apparatus for placing cells on an integrated circuit device (IC). The apparatus includes a processor and memory connected to the processor. The memory stores instructions for the processor to place the cells on the IC; to determine wire routing for the nets of the IC; to determine congested regions of the IC; and to increase fictive heights of cells of the congested regions. The memory may be any machine-readable storage medium containing the instructions for the processor to perform the steps of the present invention.

These and other aspects, features, and advantages of the present invention will be apparent to those persons having ordinary skilled in the art to which the present invention relates from the foregoing description and the accompanying drawings.

DETAILED DESCRIPTION OF THE PREFERRED EMBODIMENT(S)

Figure 1:
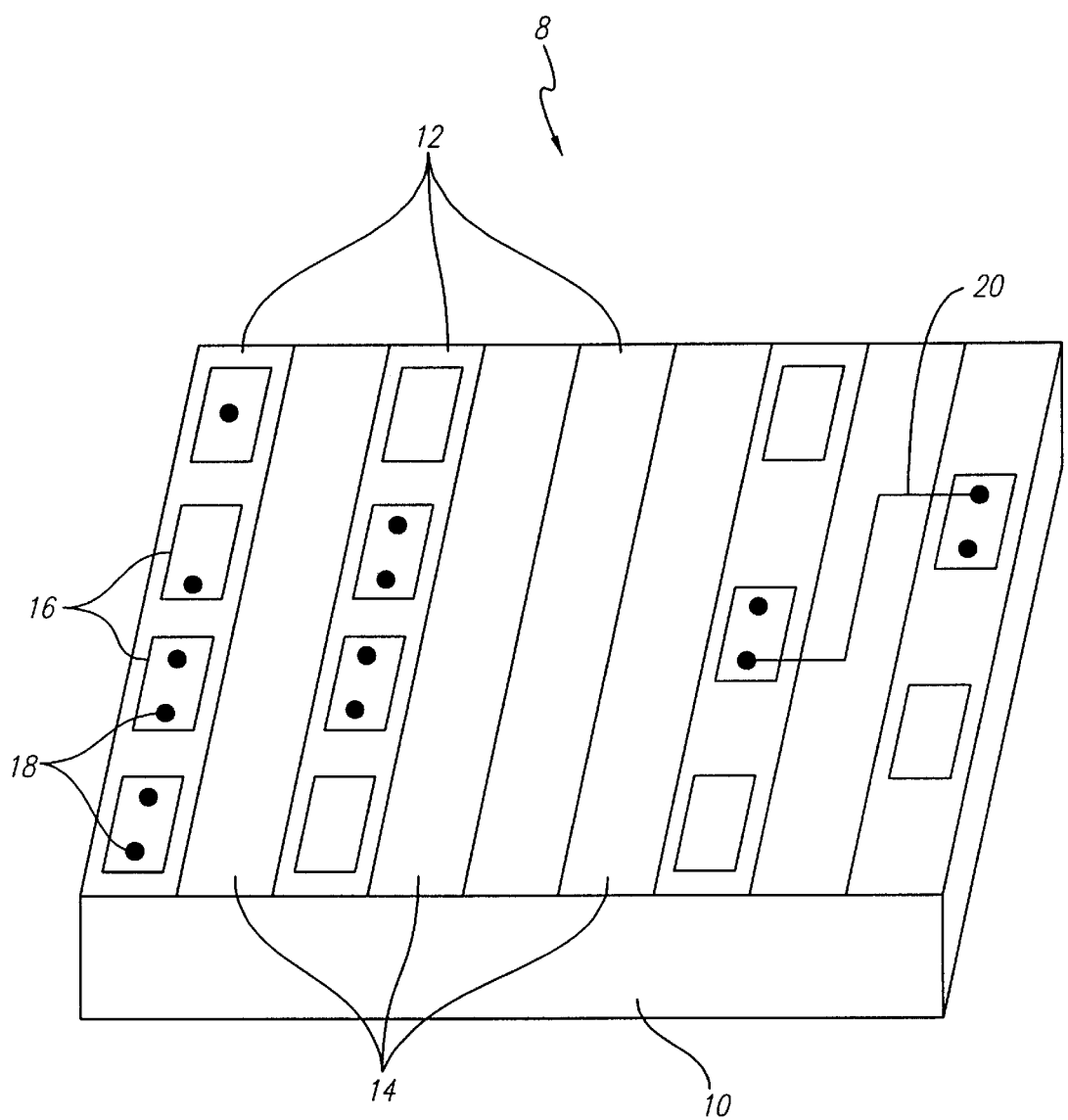
FIG. 1 is a simplified illustration of an integrated circuit chip on a semiconducting material.
Figure 2:
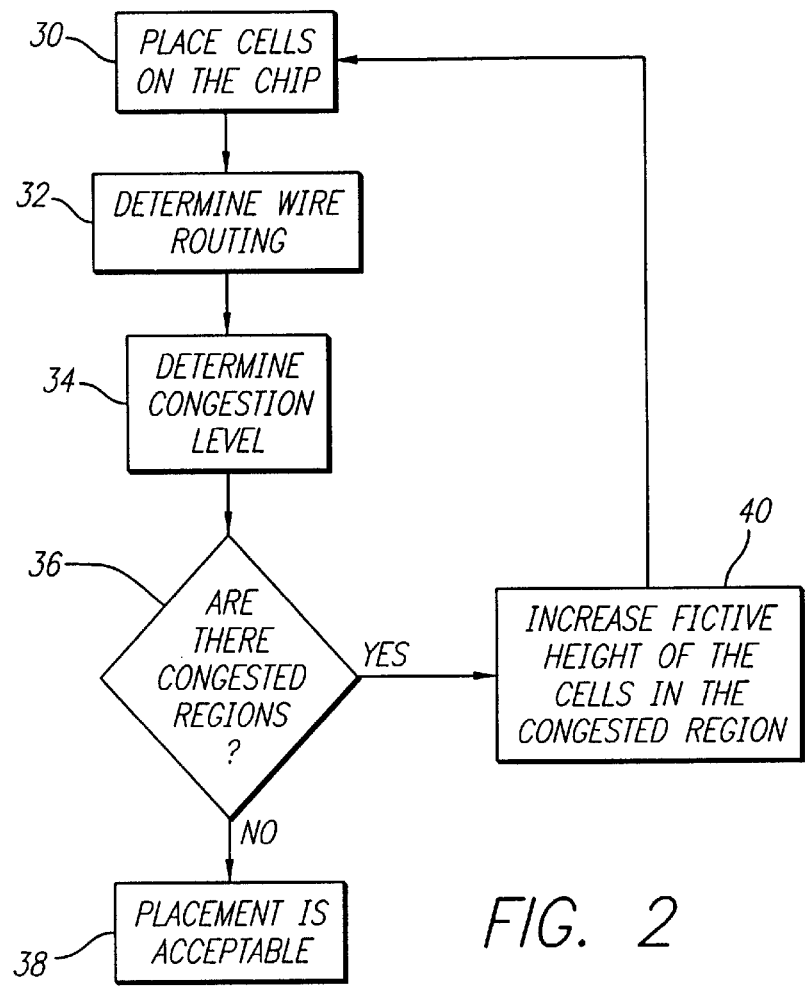
FIG. 2 is a flowchart illustrating the steps of the present invention.

Referring now to FIG. 2, a flowchart illustrating the steps of the present invention to place cells on integrated circuit chips, or semiconductor devices, (IC's), to avoid congestion.

The method of the present invention begins by placing 30 cells on an IC. Cell "placement" means determining the location of the cells on the semiconductor device. There are many cell placement techniques in use today. All of the techniques, when placing the cells, takes into account the characteristics of the cells, the cell size (the cell's "height"), and the relationship between the cells to be placed. Typically, the "cell size" for the purposes of the cell placement techniques is synonymous with the "cell height" because the cell's thickness and the width are standardized, and the cells are fabricated into columns of the IC where the width of the columns is predetermined to accommodate the cells. To place the cells, the cells placement methods typically utilize the technique of using fictive heights of the cells. Fictive height of a cell is a "fictional," height assigned to the cell for the purposes of the placement. The fictive heights are used to calculate the space, or the number of cell height units, required to place the cell on the chip.

The actual height of a cell is usually measured in microns. Because all of the standard cells have the same width, the cell height is usually used as the measure of capacity as well has the height of the cell. For example, if a cell has an actual height of 10 microns, its fictive height may be set to 10 or any other number typically greater than 10. When the cell is placed on the chip, it is allocated the space in accordance with its fictive height.

For the purposes of the present invention, it is not critical which method of cell placement is used.

Continuing to refer to FIG. 2, the next step in the method of the present invention is to determine the routing 32 of the wires connecting the pins in accordance with the netlist. The routing step produces an edgelist. An edgelist is a list of edges where an edge is the connection, or routing, between two pins. The pins of an edge may be an actual pin of a cell or a Steiner pin. A Steiner pin is a point or a pin defined during the routing process. A Steiner pin is not associated with a cell, but is used during wire routing to form a better routing solution. An edge may be a "normal" edge defined by a pair of pins which share a same vertical or horizontal coordinate, or an edge may be a superedge. A superedge is defined by a pair of pins which do not share same a vertical or an horizontal coordinate and can be characterized as a minimal bounding box containing the connected pins.

After the cells are placed and the nets routed, the congestion of the chip is determined 34 by defining vertical segments, horizontal segments, and column segments; determining the number of wires crossing each segment; and comparing that number to the capacity of the segments (the maximum number of wires that each of the segments can accommodate). If the number of wires crossing a segment exceed the capacity of the segment, then the placement is not workable. Moreover, if the ratio between the number of wires crossing a segment to the capacity of the segment exceeds a predetermined value, then the placement may not be desirable.

Figure 3:
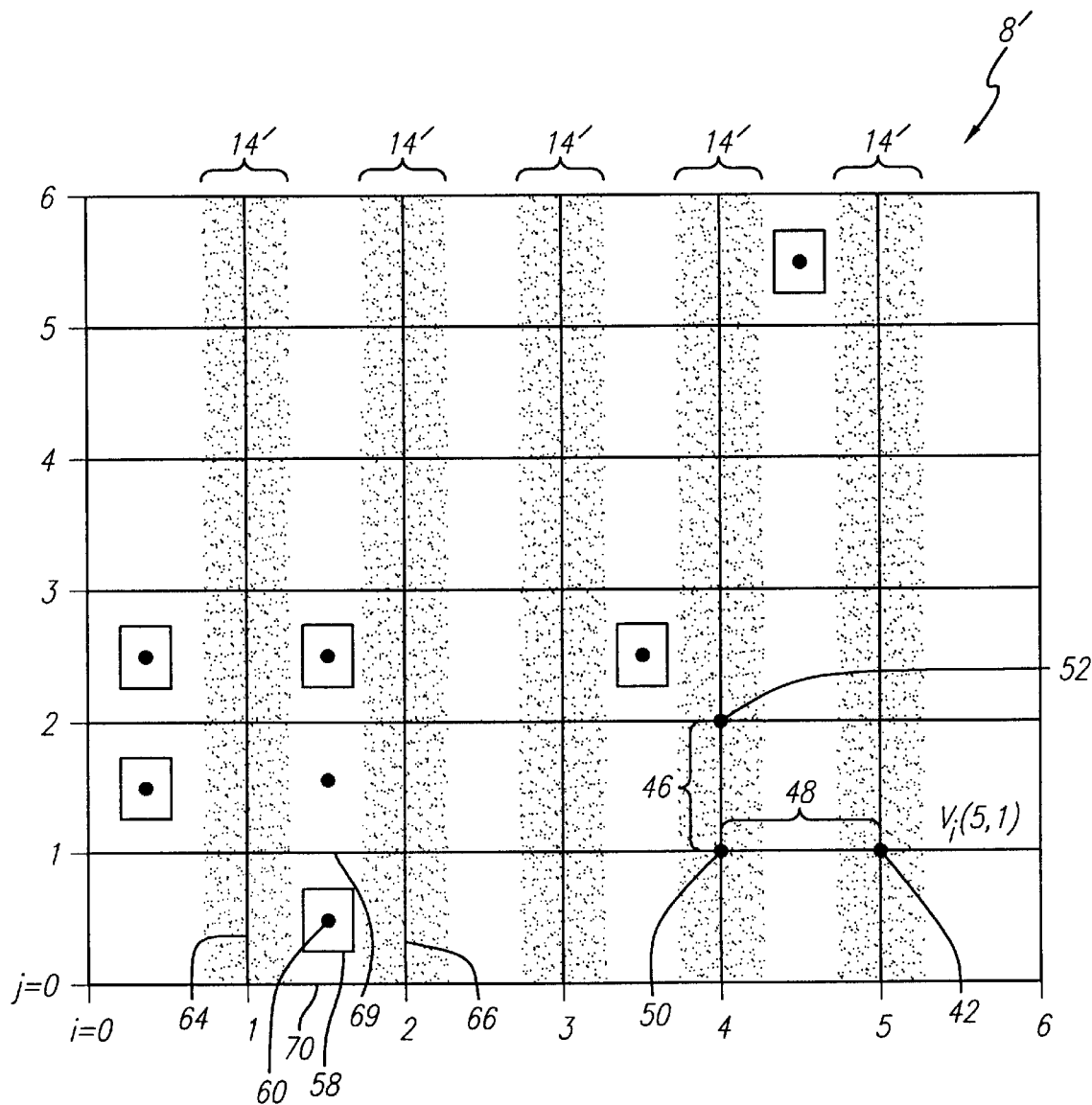
FIG. 3 illustrates vertical and horizontal segment definitions.
Figure 4:
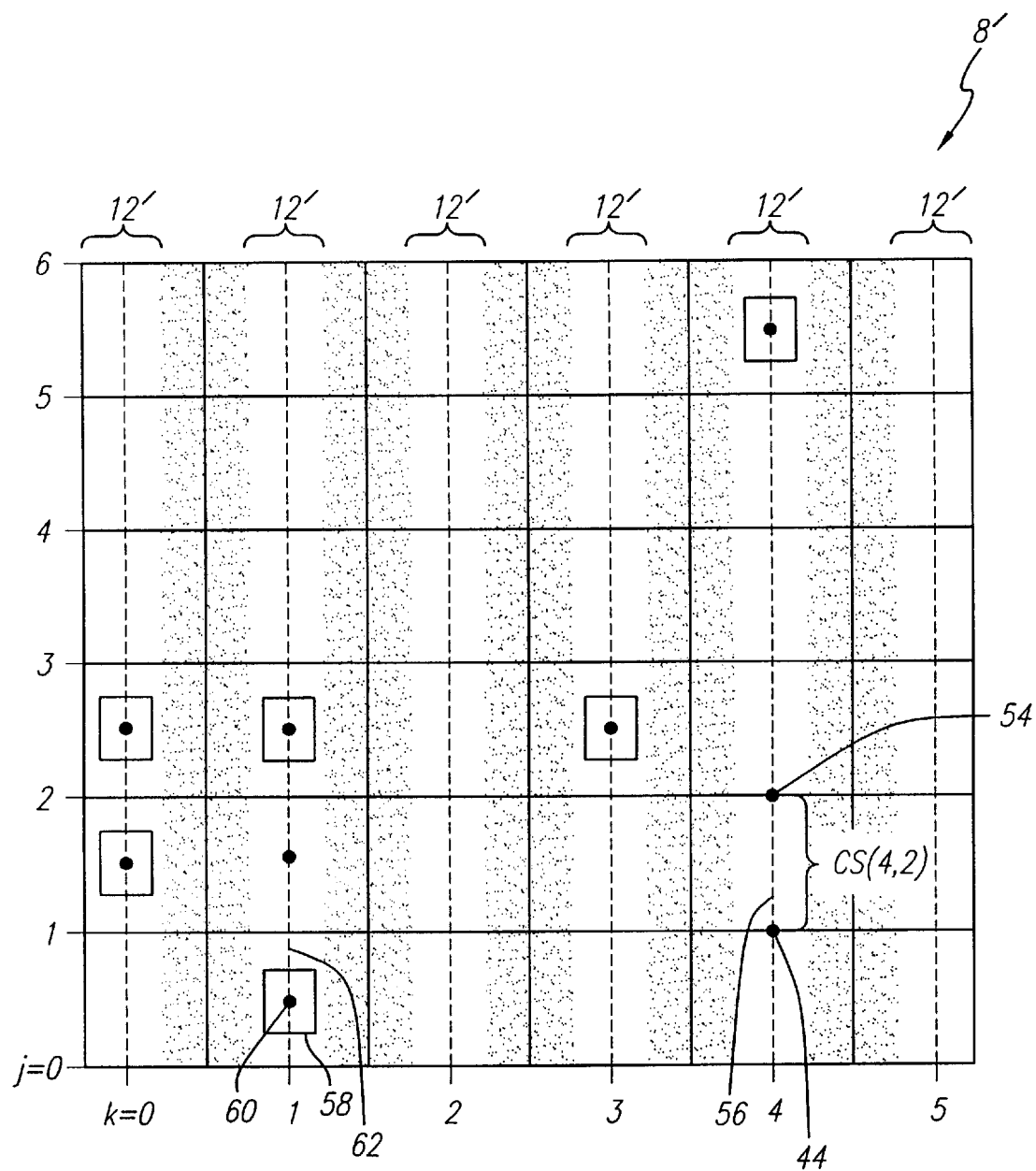
FIG. 4 illustrates column segment definitions.
Figure 5:
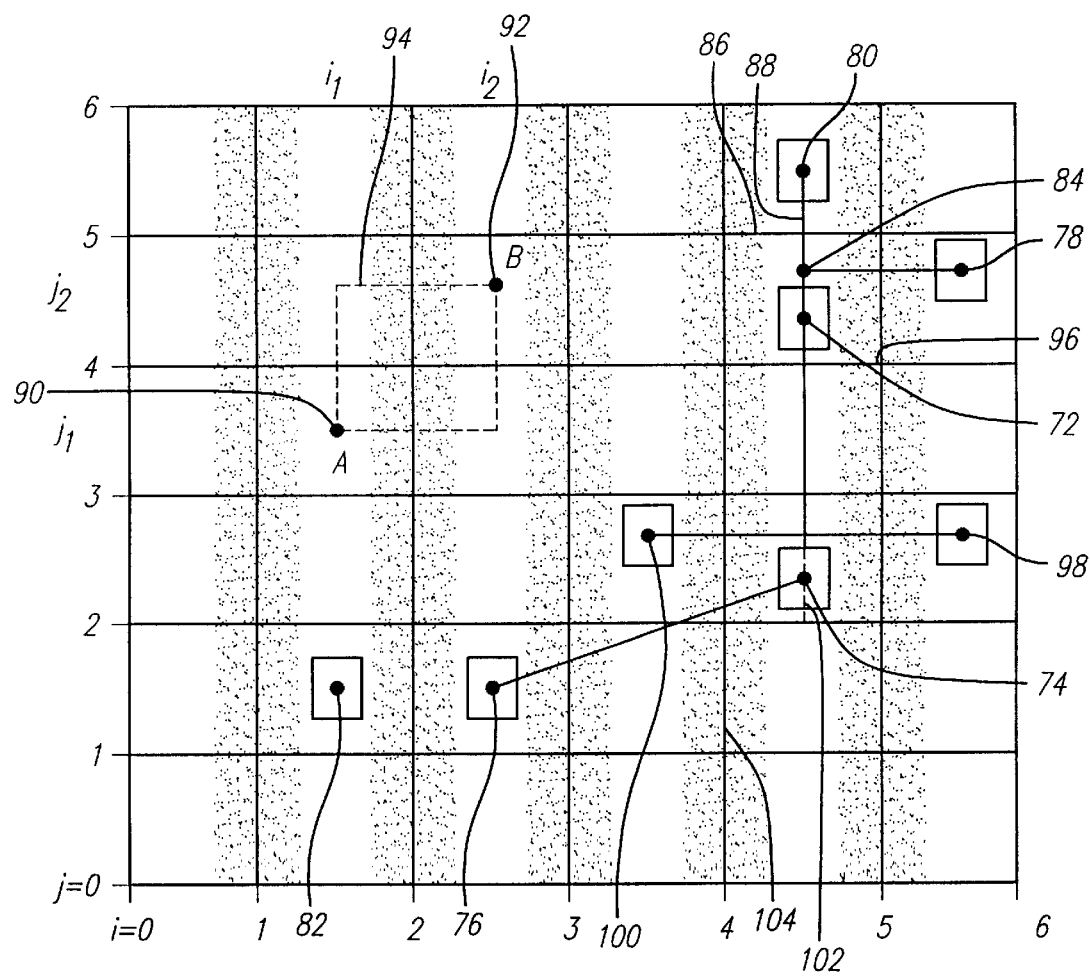
FIG. 5 illustrates how nets are used to determine congestion.

The definition of the segments and the congestion determination processes can be explained using a sample IC layout as illustrated by the IC 8' of FIGS. 3, 4, and 5. As discussed above, the IC's are typically organized into columns 12' and channels 14' which are formed between the columns 12'. The IC 8' is initially divided into a matrix of regions by defining vertical and horizontal lines on the surface. The size of the regions, thus the space between the vertical and the horizontal lines arbitrary. However, in the preferred embodiment, the vertical lines are defined in the middle of the channels. The number of horizontal lines are typically set to equal the number of vertical lines. This design provides for a substantially square regions.

To simplify the discussion, the vertical lines running through each of the channels (as shown in FIG. 3) will be called the i-lines and be referred to by the index character i. The horizontal lines will be called the j-lines and be referred to by the index character j. The vertical lines running through each of the columns (as shown in FIG. 4 as dashed lines) will be called the k-lines and be referred to by the index character k. FIGS. 3 shows seven (7) i-lines i=0 to i=6. FIG. 4 shows six (6) k-lines k=0 to k=5. And, FIGS. 3 and 4 both show seven (7) j-lines j=0 to j=6.

The intersection of the lines define vertices and the sections of the lines between two vertices are segments. For instance, the vertex 42 of FIG. 3 is defined by j-line 1 and i-line 5 and is denoted vi(5, 1). The vertex 44 of FIG. 4 is defined by j-line 1 and k-line 4 and is denoted vk(4, 1). The vertical segment 46, vs(4, 1), is defined by the two vertices, 50 and 52 forming its endpoints. The horizontal segment 48, hs(4, 1), is defined by the two vertices, 42 and 50 forming its endpoints. The column segment, 56 of FIG. 4 is denoted cs(4, 2) and is defined by its endpoints 44 and 54.

Further, in the example of FIGS. 3 and 4, the cell 58 has pin 60 and is located in a column surrounded by vertical segments 64 and 66 and horizontal segments 68 and 70. The cell 58 is also located on column segment 62.

Any number of vertical lines may be defined for the chip; however, if the vertical lines are defined in the channels of the IC, the number of the vertical lines are equal to the number of channels. Likewise, any number of horizontal lines may be defined for the purposes of implementing this invention. If the number of horizontal lines are equal to the number of vertical lines, then the lines define substantially square regions. Likewise for the column lines.

To assign coordinates and to measure distances on the IC, a rectangular coordinate grid is used. The coordinate grid has its origin, (0, 0), at the left bottom corner of the IC, and has a horizontal x-axis and a vertical y-axis. In the current art, a typical coordinate grid unit size is about 2 microns but this is expected to decrease as the technology progresses.

In any event, the number of lines and the segment lengths are predetermined. Because the segments lengths are predetermined and the thickness of the wires (to be used in routing) is predetermined, the capacity of the segments to accommodate the wires is also predetermined. The capacity of the segments, or the maximum number of wires which a segment can accommodate, is same as the size of the segment because one wire is fabricated on each of the grid lines. For typical CMOS process, the wires are 0.3 to 0.7 microns thick. In a preferred embodiment, the length of the line segments are equal to the sum of the width of a column and the width of a channel. In the CMOS process, this is approximately 15 to 20 microns wide. However, the vertical, horizontal, and column segments need not be defined to have equal lengths. In fact, the each of the segments may have a different length from any other. The following nomenclature will be used in this specification to simplify the discussion:

vcap(i, j) vertical capacity of the horizontal segment hs(i, j);

hcap(i, j) horizontal capacity of the vertical segment vs(i, j); and ccap(k, j) horizontal capacity of the column segment cs(k, j).

Note that the horizontal segments are intersected by vertical wires, thus have vertical capacities and the vertical segments are intersected by horizontal wires, thus have horizontal capacities. The column segments are, in fact, vertical segments defined in columns; therefore, the column segments have horizontal capacities.

The next step in determining congestion is to determine the number of wires routed through each of the segments under the current routing scheme. This number is referred to as the density of the segment. Horizontal segments has vertical wires crossing them; therefore, each of the horizontal segments has vertical density. Vertical segments and column segments have horizontal wires crossing them; therefore, each of the vertical and column segments has horizontal density. Alternatively expressed, hs(i, j) has vden (i, j), vs(i, j) has hden(i, j), and cs(k, j) has hden(k, j).

The number of wires routed through each of the segments is determined by examining the edgelist of the IC and counting the number of wires routed through each of the defined segments. If the wire routing procedure 32 resulted in an edgelist containing only "normal" edges, then the number of wires routed through each of the segments can be determined by counting the edges routed through each of the segments. If the edgelist contains superedges as well as the normal edges, then the superedges are counted to contribute a portion of a wire to the segment. To illustrate the technique of determining the number of wires routed through each of the segments, two nets shown in FIG. 5 is used. For illustrative purposes only, FIG. 5 shows the following three nets:

net N1 having pins 78, 80, 82 and Steiner pin 84 defined by edges 80–84, 78–84, and a superedge 82–84;

and net N2 having pins 72, 74, and 76 defined by edge 72–74 and a superedge 74–76;

and net N3 having pins 98 and 100.

For horizontal segment hs(4, 5) 86, the number of vertical wires routed through the segment 86 can be determined simply by counting the number of wires routed through the segment. In the present example, only one wire 88 is routed through the segment 86. The edge 88 can also be referred to by its two pins 84, 80, as the edge 78–80. Thus, vden(4, 5)=1.

The density contribution of the superedges to the segments can be calculated as follows: let A 90 and B 92 of FIG. 5 be the pins defining a superedge edge E 94. Also, let the horizontal segments intersecting the bounding box of E 94 be in the range $i_1$ and $i_2$ and the vertical segments intersecting the bounding box of E 94 be in the range $j_1$ and $j_2$, then the probability that the actual routing of E will intersect any horizontal segment of the bounding box E can be assigned $1/(i_2-i_1+1)$ for each of the hs(i, j) where $i_1 \leq i \leq i_2$ and $j_1 \leq i \leq j_2$.

Therefore, in general, for a superedge A-B where the superedge defines a bounding box in the range from $i_1$ to $i_2$ and from $j_1$ to $j_2$, vden(i, j) for each of the hs(i, j) where $i_1 \leq i \leq i_2$ and $j_1 \leq i \leq j_2$ is increased by $1/(i_2-i_1+1)$. Likewise, for the superedge A-B, hden(i, j) for each of the vs(i, j) and cs(k, j) where $i_1 \leq i \leq i_2$, $j_1 \leq i \leq j_2$, and $i_1 \leq k \leq i_2$ is increased by $1/(j_2-j_1+1)$.

The above-described technique for accounting for superedges by allocating horizontal, vertical, and column segment densities assume uniform probability distribution; however, more sophisticated probability distribution can also be used.

Applying the above-described superedge technique to the example as illustrated by FIG. 5, the density of the other segments can be determined. For instance, the following are the densities of some of the selected segments of the example:

vden(4, 4)=1.25; this is because the hs(4, 4) 96 has edge 72–74 contributing one (1) wire and superedge 82–84 contributing 0.25 (using the above technique) to the vertical density of the hs(4, 4); and hden(4, 2)=1.5; 1 from the edge 98–100, and 0.5 from superedge 74–76.

To determine the horizontal density of a column segment, two additional factors must be considered. First, the pins, including the Steiner pins, must also be counted. Second, when an edge terminates on the column segment, the pin is counted, but not the edge. For instance FIG. 5 shows cs(4, 2) 102. To avoid clutter, FIG. 5 shows only one column segment. The hden(4, 2) in this case is 2.25. This is because the edge 98–100 contributes hden of 1, the pin 74 is counted as 1, and the superedge 82–84 contributes the hden of 0.25.

After the determination of the wire densities for each of the segments, the congestion level can be determined by calculating the ratio between the densities to the capacities of each of the segments. For instance, the vertical congestion, vcong, of an horizontal segment hs(i, j) is the ration of vden(i, j) to vcap(i, j). Alternatively expressed, vcong(i, j)=vden(i, j)/vcap(i, j).

Likewise hcong(i, j)=hden(i, j)/hcap(i, j); for horizontal congestion of vertical segments and ccong(k, j)=hden(k, j)/ccap(k, j); for horizontal congestion of column segments.

The congestion level greater than one (1) for a particular segment means that the density of the segment is greater than the capacity of the segment. The cell placement and the wire routing which leads to such densities cannot be implemented. Any segment having a congestion level greater than a predetermined value is considered "congested. " The predetermined value is typically equal to or less than one (1).

The congestion level of the segments can be used to determine (26 of FIG. 2) the congestion level of each region of the matrix. The congestion level of a region is the highest congestion level of among the five segments associated with that region—two vertical, two horizontal, and one column segments. For instance, the region containing cell 58 of FIG. 3 is associated with the vertical segments 64 and 66, horizontal segments 68 ad 70, and the column segment 62 of FIG. 4. The congestion level of that region is the highest congestion level among the congestion level of the segments 64, 66, 68, 70, and 62. The density of border segments (segments which define the outer border of the matrix), such as segment 70 of FIG. 3, are typically zero (0).

If any of the regions of the matrix is congested (has the congestion level greater than a predetermined level), then the congestion is alleviated by increasing the fictive heights 28 of the cells of the region and repeating the placement step 30 of the process. By increasing the fictive heights, more space is allocated to the cells of the region during the placement of the cells, thereby allow more room for routing of the wires for the region.

The real heights of the cells typically range from 6 to 60 microns. The cell fictive heights may be increased arbitrarily; however, in a preferred embodiment, the following fictive height increases have been used:

| If the congestion is: | Increase the cell fictive height by |
|---|---|
| less than 1 | 0 |
| equal to or greater than 1 but less than 1.5 | 4 grid units |
| equal to or greater than 1.5 but less than 2 | 5 grid units |
| equal to or greater than 2 | 6 grid units |

Figure 6:
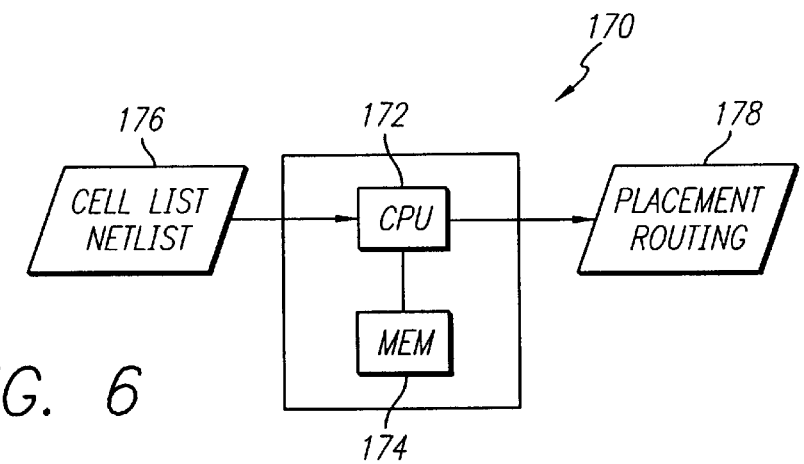
FIG. 6 is a block diagram illustrating an apparatus according to a preferred embodiment of the present invention.

Now referring to FIG. 6, a computing apparatus 170 for placing cells on an integrated circuit device (IC) is illustrated. The apparatus comprises a processor 172 and memory 174. The memory 174 stores instructions for the processor 172 for the processor 172 to place the cells on the IC, determine wire routing for the nets; determine congested regions; and increase fictive heights of cells of said congested regions. The memory further comprises instructions for the processor to perform the method of the present invention discussed above including, but not limited to, the step of repeating the steps of placement, routing, congestion determination, and fictive height increase.

Also stored in the memory 174 are instructions for the processor 172 to read cell list and netlist 176. Then, after placing the cells and routing the nets, the processor 172 is instructed to write the resultant placement and the routing information 178 to an output device.

The memory may be any kind of machine-readable storage medium containing the instructions for the processor. It is well known in the art that the memory may be formed as a semiconductor memory device, magnetic device, optical device, magneto-optical device, floppy diskette, hard drive, CD-ROM, magnetic tape, computer memory, or memory card.

Although the present invention has been described in detail with regarding the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail herein above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method of placing cells on an integrated circuit device (IC) having cells with pins, nets to define connections between the pins, and columns and channels, said method comprising the steps of:
   (a) placing the cells on the device;
   (b) determining wire routing for the nets;
   (c) determining congested regions;
   (d) increasing fictive heights of cells of said congested regions; and
   (e) repeating the step of placing the cells on the device utilizing the increased fictive heights.

2. A method according to claim 1 further comprising the step of repeating said steps (b), (c), (d), and (e) of claim 1 until no congested region is found.

3. A method according to claim 1 wherein said step of determining congested regions comprises steps:
   defining vertical segments, horizontal segments, and column segments, each segment having a capacity defining maximum number of wires and pins which can be fabricated across said segment; and
   determining density as the actual number of wires each segment is required to accommodate.

4. A method according to claim 3 wherein said step of determining congested regions further comprises steps:
   comparing, for each of said segments, said density with said capacity to obtain a ratio;
   selecting, for each region of the IC, the highest ration among five segments associated with the region; and
   comparing said ration to a predetermined value.

5. A method according to claim 4 wherein said steps of claim 4 are repeated for each of the regions of the IC.

6. A method according to claim 4 wherein the fictive heights of the cells of congested regions are increased.

7. A method according to claim 4 wherein the fictive heights of the cells of congested region are not increased if said ration is less than one, increased by eight microns if said ration is not less than one and is less than 1.5 increased by ten microns is said ration is not less than 1.5 increased by ten microns if said ratio is not less than 1.5 and is less than two, increased by twelve microns if said ratio is not less than two.

8. A method according to claim 3 wherein said column segments are defined by defining a vertical line along the middle of each channel of the IC and defining horizontal lines across the IC, said vertical lines and said horizontal lines orthogonally intersecting the other and dividing the others into vertical segments and horizontal segments respectively.

9. A method according to claim 8 wherein said horizontal lines are spaced apart by a distance approximately equal to the sum of width of a column and width of a channel.

10. A method according to claim 3 wherein said column segments are defined by defining a vertical line along the middle of each column of the IC and defining horizontal lines across the IC, said horizontal lines orthogonally intersecting said column lines dividing said column lines into column segments.

11. An integrated circuit device (IC) having cells with pins, nets to define connection between the pins, columns and channels, and having the cells optimally placed on said IC, said optimal placement method comprising the steps of:
   placing the cells on the device;
   determining wire routing for the nets;
   determining congested regions;
   increasing fictive heights of cells of said congested regions; and
   repeating the step of placing the cells on the device utilizing the increased fictive heights.

12. An apparatus for placing cells on an integrated circuit device (IC) having cells with pins, nets to define connections between the pins, and columns and channels, said apparatus comprising:
   a processor;
   a memory connected to said processor;
   said memory having instructions for said processor to
      place the cells on the device;
      determine wire routing for the nets;
      determine congested regions;
      increase fictive heights of cells of said congested regions; and
      repeat the step of placing the cells on the device utilizing the increased fictive heights.

13. An apparatus according to claim 12 wherein said memory further comprises instruction to:
   define segments having a capacity defining maximum number of wires and pins which can be fabricated across said segment;
   determining density of each of said segments;
   comparing, for each of said segments, said density with said capacity to obtain a ratio;
   selecting, for each region of the IC, the highest ratio among five segments associated with the region; and
   comparing said ratio to a predetermined value.

14. An apparatus according to claim 12 wherein said memory further comprises instruction to:
   read cell lists and netlist; and
   write cell placement and wire routing information.

15. A machine-readable storage medium containing instructions for a processor, said instructions being the steps for the processor, said steps comprising:
   placing cells on a semiconductor device, said cells having pins requiring routing;
   determining routing for said pins;
   defining regions of said semiconductor device;
   identifying congested regions;

increasing fictive heights of cells of said congested regions; and repeating the step of placing the cells on the device utilizing the increased fictive heights.

16. A storage medium according to claim 15 wherein said storage medium is selected from a group consisting of semiconductor memory device, magnetic device, optical device, magneto-optical device, floppy diskette, hard drive, CD-ROM, magnetic tape, computer memory, and memory card.

* * * * *